(12) United States Patent
Mauder et al.

(10) Patent No.: US 7,233,031 B2
(45) Date of Patent: Jun. 19, 2007

(54) VERTICAL POWER SEMICONDUCTOR COMPONENT

(75) Inventors: Anton Mauder, Kolbermoor (DE); Holger Rüthing, München (DE); Gerhard Miller, Penzing (DE); Hans Joachim Schulze, Ottobrunn (DE); Josef Georg Bauer, Markt Indersdorf (DE); Elmar Falck, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 109 days.

(21) Appl. No.: 10/886,007

(22) Filed: Jul. 7, 2004

(65) Prior Publication Data

US 2005/0035405 A1    Feb. 17, 2005

(30) Foreign Application Priority Data

Jul. 7, 2003   (DE) ............................... 103 30 571

(51) Int. Cl.
*H01L 29/74*   (2006.01)
(52) U.S. Cl. .............................. 257/163; 257/E29.197; 257/E29.198; 257/E29.199
(58) Field of Classification Search ................ 257/341, 257/342, 109, 163, 171, E29.183, E29.197, 257/E29.198, E29.199, 29.211, 29.214
See application file for complete search history.

(56) References Cited

U.S. PATENT DOCUMENTS

| | | | |
|---|---|---|---|
| 4,165,517 A | | 8/1979 | Temple et al. |
| 4,617,583 A | * | 10/1986 | Shinohe et al. ............. 257/148 |
| 5,049,965 A | * | 9/1991 | Schulze et al. ............. 257/156 |
| 5,284,780 A | * | 2/1994 | Schulze et al. ............. 438/139 |
| 5,491,351 A | * | 2/1996 | Bauer et al. ................. 257/152 |
| 5,623,151 A | * | 4/1997 | Ajit ............................. 257/212 |
| 5,710,445 A | * | 1/1998 | Bauer et al. ................. 257/147 |
| 5,904,510 A | * | 5/1999 | Merrill et al. .............. 438/154 |
| 5,939,736 A | * | 8/1999 | Takahashi .................... 257/147 |
| 5,945,691 A | | 8/1999 | Tomomatsu et al. |
| 6,049,965 A | * | 4/2000 | Perkins, Jr. .................. 29/558 |
| 6,351,024 B1 | | 2/2002 | Ruff et al. |
| 6,359,309 B1 | * | 3/2002 | Liao et al. ................... 257/341 |
| 6,441,408 B2 | * | 8/2002 | Porst et al. .................. 257/139 |
| 6,723,586 B1 | * | 4/2004 | Niedernostheide et al. . 438/133 |
| 2001/0005024 A1 | * | 6/2001 | Bauer et al. ................. 257/109 |
| 2002/0038887 A1 | * | 4/2002 | Ninomiya et al. .......... 257/336 |
| 2002/0167001 A1 | * | 11/2002 | Chen et al. .................... 257/10 |
| 2002/0167021 A1 | * | 11/2002 | Chen et al. .................. 257/163 |
| 2004/0084724 A1 | * | 5/2004 | Kapels et al. ............... 257/330 |
| 2005/0242367 A1 | * | 11/2005 | Clavelier et al. ........... 257/107 |
| 2006/0035436 A1 | * | 2/2006 | Schulze ....................... 438/345 |
| 2006/0060238 A1 | * | 3/2006 | Hacke et al. ................ 136/256 |
| 2006/0137600 A1 | * | 6/2006 | Ellison et al. ................ 117/19 |

FOREIGN PATENT DOCUMENTS

| | | |
|---|---|---|
| DE | 27 38 152 A1 | 8/1978 |
| DE | 39 32 490 A1 | 4/1991 |
| DE | 43 13 170 A1 | 10/1994 |
| DE | 44 10 461 C1 | 6/1995 |
| DE | 196 11 689 A1 | 1/1997 |
| DE | 198 04 580 A1 | 8/1999 |
| EP | 0 419 898 A2 | 4/1991 |

\* cited by examiner

*Primary Examiner*—M. Wilczewski
(74) *Attorney, Agent, or Firm*—Maginot, Moore & Beck

(57) ABSTRACT

A vertical power semiconductor component, e.g. a diode or an IGBT, in which there are formed, on the rear side of a substrate, a rear side emitter or a cathode emitter and, over that, a rear side metal layer that at least partly covers the latter, is defined by the fact that, in the edge region of the component, provision is made of injection attenuation means for reducing the charge carrier injection from the rear side emitter or the cathode emitter into said edge section.

14 Claims, 6 Drawing Sheets

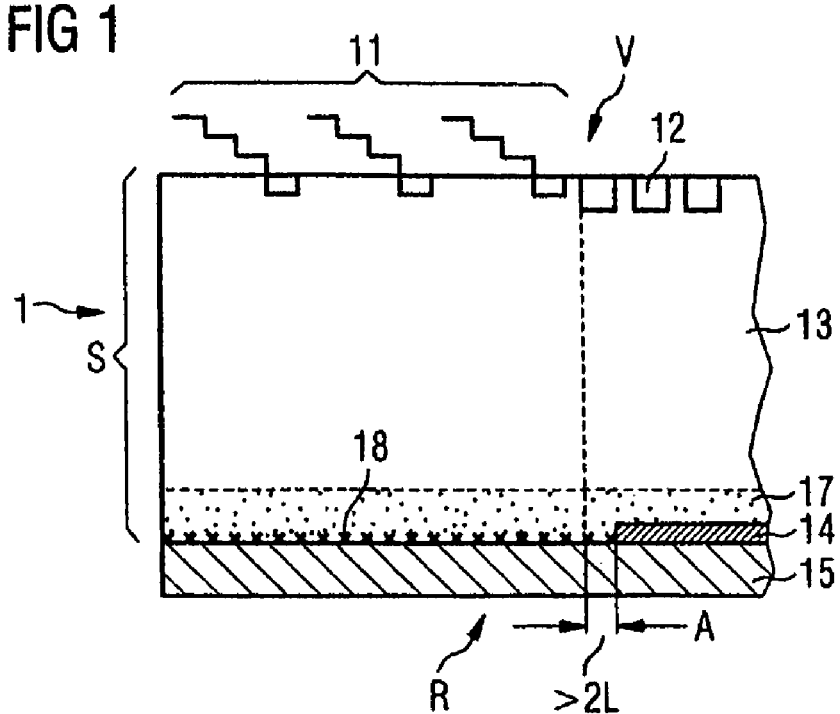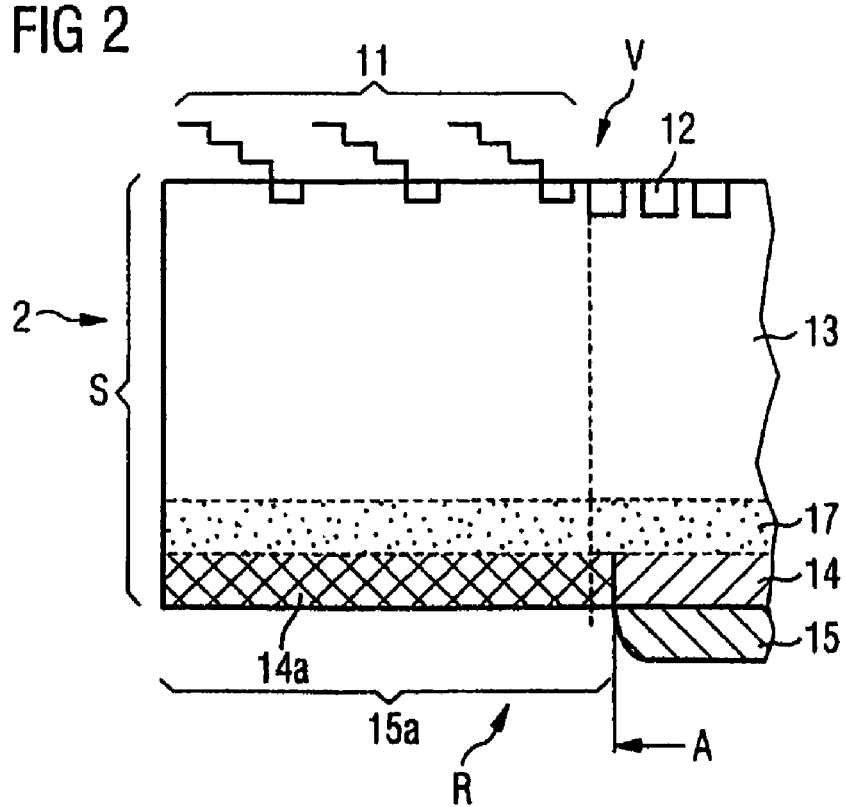

VERTICAL POWER SEMICONDUCTOR COMPONENT

BACKGROUND

The invention relates to a vertical power semiconductor component, e.g. a vertical high-voltage diode, a GTO or a vertical IGBT (Insulated Gate Bipolar Transistor), in which there are formed, on the rear side of a substrate, a cathode or a cathode emitter or an anode or an anode emitter or a rear side emitter of an IGBT and, over that, a rear-side metal layer that at least partly covers the latter.

In the edge region of vertical power semiconductor components, such as diodes or IGBTs, dynamic effects, caused by free charge carriers may cause a significant reduction of the blocking capability in said edge region with respect to the ideal breakdown voltage and also with respect to the blocking capability of the active region during the turn-off operation. During the turn-off operation, it may happen, on account of the resulting increased charge carrier concentration in the regions of the edge or the drive terminals, that both the electric field strength in the silicon and the field strengths in $SiO_2$ layers or further insulator layers which have been deposited on the silicon surface for the purpose of passivation or field plate formation in the edge region are greatly increased. By virtue of field strength spikes, an avalanche breakdown in the silicon or a breakdown of the oxide or of the insulator layer may occur there.

Instead of p-rings with field plates, it is also possible to use other edge constructions, such as with p-rings without field plates or VLD edges with an electroactive, semiinsulating or else insulating covering individually or in combination also with further edge terminations known per se. For all these edge terminations, the measures described lead to an improvement in the dynamic properties.

EP 0 419 898 describes methods which, in the case of thyristors, by means of a laterally inhomogeneous carrier lifetime setting, lower the concentration of free charge carriers in the edge region and thus increase the static and dynamic blocking capability of the thyristor. However, this procedure often requires a considerable process complexity and is thus expensive. Similar methods are used in the prior art in the case of diodes, too, for achieving a laterally inhomogeneous carrier lifetime.

SUMMARY

In view of the disadvantages of the prior art outlined above, it is an object of the invention to specify effective and simple and therefore cost-effective means for reducing the concentration of free charge carriers in the edge region or in the region of the control terminals of a vertical power semiconductor component, e.g. an IGBT or a high-voltage diode, in order to increase the static and dynamic blocking capability and to increase the robustness of the component.

The invention is described by way of example on the basis of a diode having an edge termination on the anode side. It can also be used for IGBTs, for example, which involves processing the p-doped collector region on the rear side under the edge termination and/or under the gate pad region in the manner described. Generally, the measures described are always suitable for that side of the semiconductor component which is opposite to the side with the edge termination.

Consequently, in accordance with one essential aspect, the invention proposes a vertical power semiconductor component which is defined by the fact that, in the edge region of the component, provision is made of injection attenuation means for reducing the charge carrier injection from the cathode or the cathode emitter into said edge section.

Measures of this type can be taken for high-voltage diodes GTOs and also for IGBTs.

What is common to all the injection attenuation means described below is that they are arranged under the edge region or under the region of the drive terminals of the power semiconductor component. Expediently and preferably, the injection attenuation means also reach at least two charge carrier diffusion lengths under the active area.

In a preferred embodiment, the injection attenuation means are formed such that they impair or prevent the ohmic contact between the rear side metallization and the substrate in the edge section of the component.

The injection attenuation means may have a non-annealed zone in a rear side emitter—applied over the whole area—locally in the edge region of the component, which zone ensures that there the carrier lifetime is drastically reduced and the injection into the critical chip regions e.g. the edge or the gate pad, is substantially reduced.

Furthermore, the injection attenuation means may have a non-annealed zone in a field stop—introduced by proton doping—in the edge region of the component, which zone likewise significantly reduces the injection into the critical chip regions, such as e.g. the edge of the chip.

In the case of an IGBT, the injection attenuation means may preferably be formed by a rear side emitter drawn back from the edge of the component. In this case, the lateral extent of the rear side emitter is preferably at least two diffusion lengths smaller than the lateral extent of a cell array with body zones on the front side of the component.

In an alternative embodiment, in the case of an IGBT, the injection attenuation means may be formed by the rear side metallization drawn back from the edge, and in this case, too, the lateral extent of the rear side metallization toward the edge of the component is smaller than the lateral extent of a body section on the front side of the IGBT.

The latter measure has an advantageous effect particularly where the injection attenuation means additionally have, in the edge section in which the rear side metallization is not present, a cathode or rear side emitter section destroyed by ion implantation.

For the case where the vertical power semiconductor component is a high-voltage diode, in one embodiment, the injection attenuation means may be formed by a cathode drawn back from the edge. In an alternative embodiment of the high-voltage diode, in which the cathode has a two-stage doping profile, the more deeply diffused part of the cathode being formed as a field stop zone and the part of the cathode with a smaller diffusion depth being formed as a transparent or only slightly annealed emitter, the injection attenuation means may be formed by the rear side metallization drawn back from the edge.

In a further alternative embodiment of a high-voltage diode according to the invention, whose cathode has a two-stage doping profile as described above, the injection attenuation means may be formed by a buried layer that destroys the transparent emitter in the edge section, the buried layer preferably comprising amorphized silicon, $Si_3N_4$ or $SiO_2$. In the case of a high-voltage diode according to the invention as well, the lateral extent of the drawn-back cathode or of the drawn-back metal layer or of the undestroyed transparent emitter toward the edge of the component may preferably be smaller than the lateral extent of an anode on the front side toward the edge of the high-voltage diode.

In the case of an IGBT configured according to the invention, the rear side emitter is preferably a p-doped emitter, while in the case of a high-voltage diode according to the invention, the cathode is preferably an n-doped cathode emitter.

The invention's proposed restriction of the lateral extent of the p-emitter of the IGBT according to the invention such that it has a smaller lateral extent than the opposite p-body region, in other words the edge region of the IGBT and the outer part of the p-body have no p-emitter on the collector side, results in a reduction of the free charge carriers in the edge region of the component both in the turned-on state and during the turn-off operation. This has the effect that, during the turn-off, it is necessary to transport away fewer charge carriers which dynamically steepen the electric field and thus reduce the dynamic blocking capability. What is more, in the case of the IGBT, by virtue of the reduced transporting-away of electrons to the rear side and the lack of injection of the p-emitter in the edge region during turn-off, significantly fewer holes are injected into the edge of the IGBT, while the partial transistor gain $\alpha_{pnp}$ remains fully effective in the central component region. This means an increase in the blocking capability of the IGBT edge and, if appropriate, of the gate pad region during switching in comparison with the central cell area.

In other words, given suitable dimensioning of the IGBT such as thickness, resistivity of the basic material and p-emitter efficiency, the edge region may have a higher blocking capability than the central region of the IGBT, and the voltage-dictated breakdown during turn-off thus also occurs in said central region. Since here the dynamic breakdown during turn-off occurs in a homogeneous zone of larger area and, in contrast to the edge region, not in spatially localized fashion, it is possible to cope with higher current densities. Moreover, under certain circumstances (for example in the case of presspack IGBTs), the emitter-side cooling may be better in the central region and the thermal loading of the edge thus turns out to be lower.

The reduction of the number of free charge carriers in the edge region relieves the load not only on the edge itself but also on that part of the cell array which adjoins the edge region. This part of the active area is loaded to a greater extent than more centrally situated locations of the cell array and usually has to be protected by other, complicated constructions in order that the component is not limited beyond measure in terms of its current density that can be turned off.

Analogously, in the case of a diode, the loading is relieved on that part of the p-well which adjoins the edge and likewise belongs to the critical regions.

If the edge termination is so ineffective or the emitter efficiency is so poor that the breakdown nevertheless takes place in the edge region of the IGBT, it is recommended that the p-emitter efficiency be increased for example by higher implantation doses or higher annealing temperatures or else that the total thickness of the component be reduced, so that the breakdown is shifted into the central component region, although without losing much reverse voltage in the process. This would also enable a reduction of the $V_{CESAT}$ and also—in the case of the strengthened emitter—a softer turn-off behavior in conjunction with increased turn-off losses. It is also conceivable to only locally increase the p-emitter efficiency in the cell array, as can be realized for example by means of an additional masked acceptor implantation. This may appear for example such that more highly doped p-islands are integrated in the more lightly doped whole-area p-emitter which, however, as described previously, is omitted in the edge region. It is also possible to raise the resistivity of the starting material and thus to improve the cosmic radiation endurance.

The lateral restriction of the emitter can be realized relatively simply by means of a masking oxide, nitride or resist mask which covers the edge region during the acceptor implantation. Since the lateral dimensions (width and diameter) of the collector-side p-emitter are at least two diffusion lengths, but even better three to four diffusion length, smaller than the lateral extent of the p-body region on the front side, the influence of the lateral diffusion of free charge carriers is largely restricted. The invention's procedure of restricting the lateral extent of the collector-side p-emitter can be used both for annealed emitters (that is to say annealing temperatures >700° C.) and for so-called transparent emitters (annealing temperatures <600° C.). In the case of a PT (Punch-Through) IGBT, an n-doped stop zone is located upstream of the collector-side p-emitter. It is recommended that said stop zone furthermore be embodied in whole-area and homogeneous fashion in order to ensure the full blocking capability. In the case of a nontransparent emitter, the rear side metallization should be embodied in whole-area fashion or generally project at least over the masked p-emitter. If a certain reverse blocking capability of the IGBT is to be realized, it is appropriate, for example, for a patterned oxide used for the masked acceptor implantation not to be stripped and to be covered with the metallization.

Of course, it is also possible in the case of IGBTs additionally to reduce the number of free charge carriers in the edge region by a lowering of the charge carrier lifetime by means of masked irradiation techniques or else by a masked heavy metal diffusion (for example platinum). In this case, however, on the one hand the masking complexity and also the costs are higher and on the other hand significantly higher leakage currents would result in the edge region during irradiation.

In the case where the IGBT has a transparent emitter, the invention proposes drawing back the metallization from the edge region. Such a transparent emitter is distinguished in particular by a relatively low electrically active doping dose and thus also by a relatively poor transverse conductivity. This brings about a reduction of the free charge carriers in the edge region of the component during the turn-off operation and thus an increase in the robustness of the IGBT edge.

The measure proposed according to the invention of damaging that region of the transparent emitter which lies outside the drawn-back rear side metallization by means of a masked irradiation to an extent such that it largely loses its electrical activity in this region makes it possible to increase the robustness in the edge region even more. The mask used for this irradiation is advantageously the drawn-back metallization itself or else the photoresist layer which is still present on the metal surface protected by this resist after the patterned metal etching. Silicon or argon, for example, are taken into consideration as atoms for this destructive implantation operation. The use of a phosphorus implantation would also be conceivable since the latter, even if it is only partially activated on account of the lack of a subsequent high-temperature step, can lead to a partial or complete compensation or even to an overdoping of the transparent p-emitter in the edge region implanted in this way.

In order to fabricate the cathode—drawn back from the edge—of a vertical high-voltage diode according to the invention, the rear side of said diode is processed as follows:

whole-area n⁻-implantation for adequate blocking property and field stop behavior of the diodes with a low dose (for example n⁻-implantation with a dose corresponding at least to the breakdown charge≈1.3 ... 1.8·10¹²/cm⁻². This gives rise to a typical surface concentration of approximately 1 to 2·10¹⁵ cm⁻³;

whole-area n⁺-implantation of the emitter and subsequent annealing with the n⁻-implantation (for example at 700° C. or higher);

phototechnology on the rear side (aligned with respect to the front side), the resist mask being used as an etching mask;

wet or dry etching process on the rear side opposite to the region of the edge termination on the front side;

precisely defined definition of the surface doping and of the remaining dose by defining the etching depth.

The etching process makes it possible to pattern the rear side emitter (cathode) of the diode and to set the surface doping and also the dose of the n⁻-profile in the edge region of the rear side in a defined manner. The abovementioned surface concentration in the case of a field stop diode of 1 to 2·10¹⁵/cm³ may already be too high in the edge region and lead to a certain charge carrier emission and thus to a reduction of the target robustness of the diode. However, the new method makes it possible to establish the surface concentration in the edge region of the diode (rear side) by means of the freely selectable etching depth.

U.S. Pat. No. 6,351,024 B1 describes an alternative possibility, in which the carrier concentration in the edge region is significantly reduced in the on-state case. For this purpose, it is possible to introduce the rear side emitter on that surface of the chip which is opposite to the edge only locally within the active area. If the distance from the edge is greater than approximately the ambipolar diffusion length in the flooded on-state case, then the carrier concentration in the edge region is effectively reduced. This results in a whole-area gettering effect on the rear side R and a reduction of the injection of the n⁻-stop zone.

In the case of the further exemplary embodiment according to the invention of a high-voltage diode whose cathode has a two-stage doping profile, the more deeply diffused part of the diode being formed as a field stop zone and the part with a smaller diffusion depth being formed as a transparent or only slightly annealed emitter, the buried layer which forms the injection attenuation means and disturbs the transparent emitter in the edge region and comprises for example SiO₂ or else amorphized Si can be realized by means of a patterned oxygen implantation with subsequent annealing or by amorphization by means of heavy, nondoping ions, such as krypton, argon or silicon, for example. This requires only a single rear side phototechnology, independently of the doping profiles used.

The abovementioned insulating or greatly damaged buried layer prevents an injection of charge carriers or the formation of plasma charge carriers in the region under the edge termination of the high-voltage diode. In this case, all processes for setting the doping profiles may remain unchanged.

BRIEF DESCRIPTION OF THE DRAWINGS

The above and further advantageous features will become even clearer in the following description of various exemplary embodiments of power semiconductor components according to the invention with reference being made to the accompanying figures of the drawings. In the figures, specifically:

FIG. 1 schematically shows a cross section through an edge section of a first exemplary embodiment of an IGBT according to the invention;

FIG. 2 shows a schematic cross section through an edge section of a second exemplary embodiment of an IGBT according to the invention;

DESCRIPTION

Figure 3:
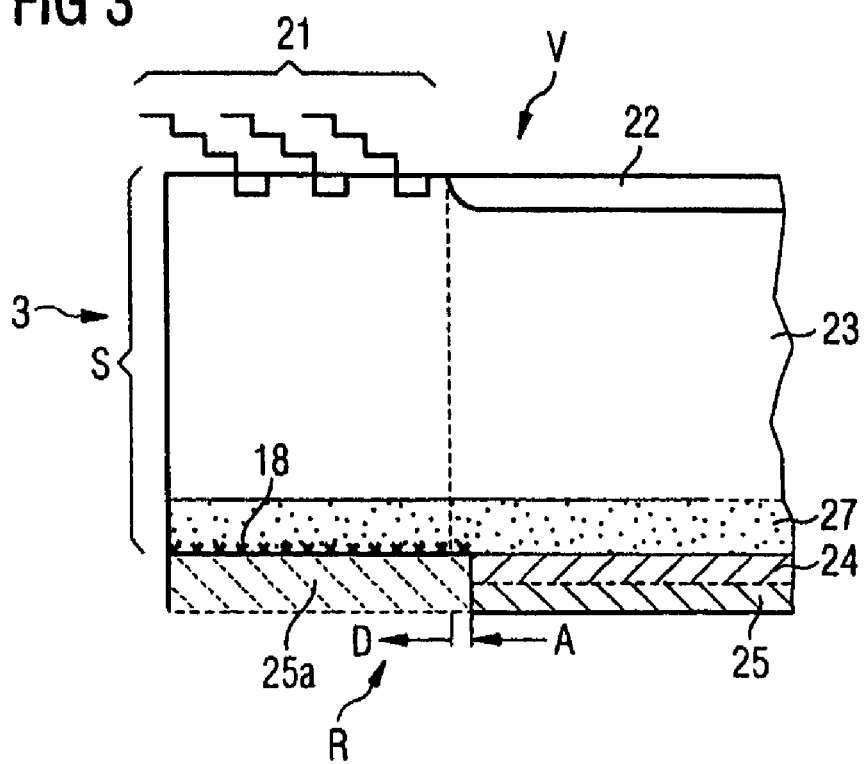
FIG. 3 shows a schematic cross section through an edge section of a first exemplary embodiment of a high-voltage diode according to the invention.

Firstly, the features of an IGBT forming a vertical power semiconductor component according to the invention are described below with reference to FIGS. 1 and 2. FIG. 1 schematically shows a cross section through an edge section of an IGBT 1 according to the invention with a cathode emitter or collector-side p-emitter 14 drawn back from the edge illustrated on the left. On the front side V of a semiconductor substrate S, up to the boundary depicted by a dashed line, a cell array is formed within a p-body 12 above an n-base 13. An edge region 11 of the IGBT 1, which edge region is provided with field plates and/or field rings, for example, adjoins to the left of the vertical dashed line. The rear side R of the IGBT 1 has a rear side metallization 15 applied in uninterrupted fashion. The collector-side p-emitter 14 is drawn back, so that the edge region 11 of the IGBT 1 and the outer part of the p-body 12 facing toward the edge do not have a collector-side p-emitter 14. In this case, the lateral extent—identified by the arrow A—of the collector-side p-emitter or cathode emitter 14 is two or more diffusion lengths L, preferably 3 to 4 diffusion lengths, smaller than the lateral extent of the cell array containing the body regions 12, which extends as far as the vertical dashed line. This measure reduces the free charge carriers in the edge region 11 of the IGBT both in the turned-on state and during the turn-off operation. This results in an increase in the blocking capability of the IGBT edge since the partial transistor gain factor $\alpha_{pnp}$ which is effective in the central component region is obviated in the edge region 11 due to the lack of injection of the p-emitter 14 and fewer charge carriers have to be transported away in order to achieve the blocking capability. The high field spikes which arise in the case of the conventional IGBT, in which the p-emitter extends as far as the edge of the component, during the depletion of the stored minority charge carriers (which are holes in this example) and may lead in the short or long term to damage to the oxide or the covering layer possibly present in the edge region 11 are avoided in the case of the IGBT according to the invention as illustrated in FIG. 1.

In other words, in the case of this IGBT, if the IGBT is suitably dimensioned with regard to thickness and ρ-value and also p-emitter efficiency, the edge region 11 may have a higher dynamic blocking capability than the central region of the component, so that the voltage-dictated breakdown during turn-off occurs in said central region. Here, however, the dynamic breakdown occurs in a homogeneous zone of larger area and, in contrast to the edge region 11, not in spatially localized fashion, as a result of which it is possible to cope with higher current densities. Moreover, under certain circumstances (such as in the case of presspack IGBTs, for example), the emitter-side cooling is better in the central region and the thermal loading of the edge is thus lower. Generally, the electrical contact between the substrate S and the rear side metal 15 is impaired, that is to say it is not ohmic, in the region 18, in which there is no p-emitter 14 present.

The lateral restriction of the p-emitter 14 as shown in FIG. 1 can be realized in a simple manner by means of a masking oxide, nitride or resist mask which covers the edge region on the rear side during the acceptor implantation. The method described can be used both for annealed emitters and for so-called transparent emitters. Furthermore, an n-doped stop zone 17 is located upstream of the p-emitter for specific IGBT types (such as in the case of the punch-through IGBT). In this exemplary embodiment, said stop zone is whole-area and homogeneous in order to ensure the full blocking capability.

The rear side metallization 15 is embodied in whole-area fashion. It should always project laterally beyond the masked emitter 14.

A second exemplary embodiment of an IGBT according to the invention, which is illustrated in the form of a schematic cross section in FIG. 2 and is designated by 2, is identical to the IGBT 1 of the first exemplary embodiment, which is shown in FIG. 1, on the front side V in the edge region 11 and in the cell array having the p-bodies 12. As an alternative, in the case of the IGBT 2 shown in FIG. 2, on the rear side R, instead of the drawn-back p-emitter, the metallization 15 is drawn back to such a degree that its lateral extent indicated by the arrow A is smaller than the lateral extent of the cell array 12 containing the p-body regions 12.

This measure of the drawn-back rear side metallization 15 is proposed particularly for an IGBT 2 with a transparent p-emitter 14. Such a transparent emitter 14 is distinguished in particular by a relatively low electrically active doping dose and thus also by a relatively poor transverse conductivity. This brings about a reduction of the free charge carriers in the edge region 11 of the IGBT during the turn-off operation and thus an increase in the robustness of the IGBT edge.

A further measure for increasing the robustness of the edge region 11 is illustrated by the crosshatched zone 14a in FIG. 2. This is achieved according to the invention by virtue of the fact that the region 15a of the transparent emitter 14, which region lies outside the drawn-back metallization 15, is damaged by a masked irradiation to an extent such that the emitter region 14a there largely loses its electrical activity. The mask used for this irradiation may advantageously be the drawn-back metallization 15 itself or the photoresist layer which is still present on the metal surface protected by this resist after the patterned metal etching. Silicon or argon, for example, are taken into consideration as atoms for this destructive implantation operation. A phosphorus implantation would also be conceivable since—even if it is only partially activated on account of the lack of a subsequent high-temperature step—it may lead to a partial or complete compensation or even to an overdoping of the transparent p-emitter 14 in the edge region 14a implanted in this way.

Furthermore, the IGBT 2 shown in FIG. 2, like the IGBT 1 already illustrated in FIG. 1, may have a field stop zone 17. In the case of Si or Ar implantation, the damage to the crystal lattice may also extend partially into the field stop zone 17 in order to reduce the injection of charge carriers from the field stop zone 17 into the base zone 23.

As will be shown further below in the course of the discussion appertaining to FIG. 4, the concept applied to the IGBT 2 can also be applied to diodes, to be precise with the precondition that their n-emitter (on the rear side) has a two-stage doping profile, the more deeply diffused part forming a field stop zone and the part with a smaller penetration depth being realized as a transparent or only slightly annealed emitter.

FIG. 3 shows, on the basis of a schematic cross section through an edge section of a vertical power semiconductor component according to the invention, a further exemplary embodiment, which is a high-voltage diode and is designated by 3. On the front side V of this high-voltage diode 3, to the right of a boundary of an edge region 21, said boundary being marked by a vertical dashed line, a p-well 22 is situated above an n-base 23 in a substrate S. A drawn-back n$^+$-emitter or an n$^+$-cathode 24, under which lies an n$^-$-doped field stop zone 27, is formed on the rear side R of the diode 3, which has a rear side metallization 25.

For this purpose, the rear side R of the diode 3 is processed as follows:
   whole-area n$^-$-implantation (of the field stop zone) for adequate blocking properties and field stop behavior of the diode 3 with a low dose, at least as high as the breakdown charge $1.3 \ldots 1.8 \cdot 10^{12}/cm^2$. This results in a typical surface concentration of approximately 1 to $2 \cdot 10^{15}/cm^3$;
   whole-area phosphorus implantation of the n-emitter and subsequent annealing together with the n$^-$-implantation of the field stop 27 (for example at 700° C. or higher or, in the case of field stop diodes with a diffusion process, for example, at 900° C.);
   phototechnology on the rear side R aligned with respect to the front side V, that is to say with respect to the p-well, a resist mask being used as an etching mask;
   wet or dry etching process on the rear side R under the edge region 21; and
   precisely defined definition of the surface doping and of the remaining dose by definition of the etching depth.

The dashed-hatched region 25a of the rear side metallization indicates that a further measure may be the omission or removal of the rear side metallization 25 in the edge region, which prevents contact to the substrate S or to the field stop zone 27 at the area designated by 18.

In the case of the above-described high-voltage diode 3 illustrated in FIG. 3, the rear side emitter 24 of the diode 3 is patterned by the etching process and the surface doping and also the dose of the n$^-$-profile are set in a defined manner in the edge region of the rear side by means of the etching process. As a result, by virtue of the freely selected etching depth, it is possible to set the surface concentration in the edge region of the diode 3 on the rear side and to greatly repress or prevent the charge carrier emission in the edge region of the diode 3 from the rear side. The etching-away of the rear side emitter is also possible, of course, in the case of IGBTs.

Figure 4:
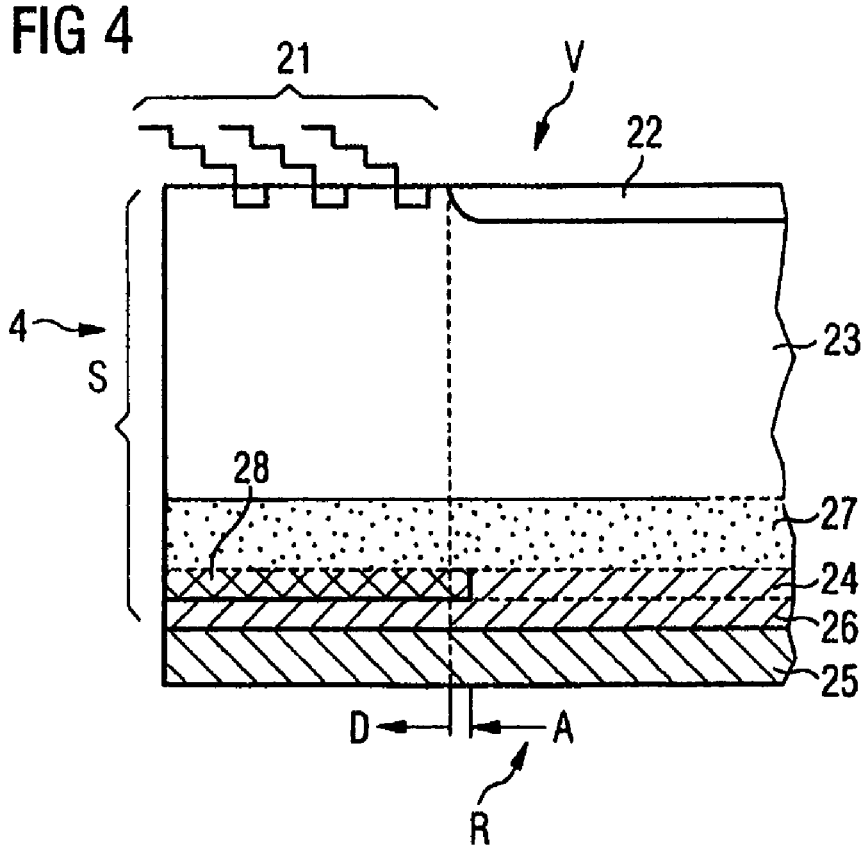
FIG. 4 shows a schematic cross section through a section lying at the edge of a second exemplary embodiment of a high-voltage diode according to the invention.

In the case of a further embodiment—shown in the form of a schematic cross section in FIG. 4—of a vertical power semiconductor component configured as a high-voltage diode 4, the front side V is configured exactly as in the case of the previously described high-voltage diode 3 illustrated in FIG. 3. On the rear side R, the high-voltage diode 4 in accordance with FIG. 4 has an uninterrupted metallization 25 and an n-emitter with a two-stage doping profile, the part diffused more deeply into the substrate S being formed as a field stop zone 27 and the part with a smaller penetration depth being formed as a transparent or only slightly annealed emitter 24. An uninterrupted layer 26 doped with annealed phosphorus is situated between said transparent emitter 24 and the rear side metallization 25. In a manner aligned with respect to the front side V, a buried layer 28 made of $SiO_2$ or amorphized silicon is formed in the edge region 21 at the depth of the n-emitter layer 24. Amorphization means the drastic reduction of the conductivity of the n-emitter layer 24 and of the charge carrier diffusion lengths. This buried layer 28 practically prevents the injection of charge carriers in the edge region 21. Consequently, no plasma can form there. This layer e.g. may be realized by a patterned oxygen implantation with subsequent annealing or, as mentioned, by amorphization by means of heavy, nondoping ions such as krypton, argon or silicon, for example.

Since the insulating or greatly damaged buried layer 28 prevents an injection of charge carriers or the formation of plasma charge carriers in the edge region 21, this avoids the high field loadings in the oxides in the edge region if the diode is used during a commutation operation. This increases the robustness and switching strength of the diode 4 and extends the reliable operating range.

One essential advantage of forming the buried layer 28 from the rear side R of the high-voltage diode 4 is that only a single rear side phototechnology is necessary independently of the doping profiles used, whereas an emitter shading by means of resist would require two rear side phototechnologies. All processes for setting the doping profiles may remain unchanged in the case of the method used during the fabrication of the high-voltage diode 4. In this case, the insulating or greatly damaged layer 28 may extend as far as the surface of the structure. The buried or only slightly annealed emitter 24 may be dispensed with in the inner region. The emitter 26, which is correspondingly adapted in terms of its efficiency, then performs both the function of the ohmic contact to the metallization and the function of the emitter.

Figure 5:
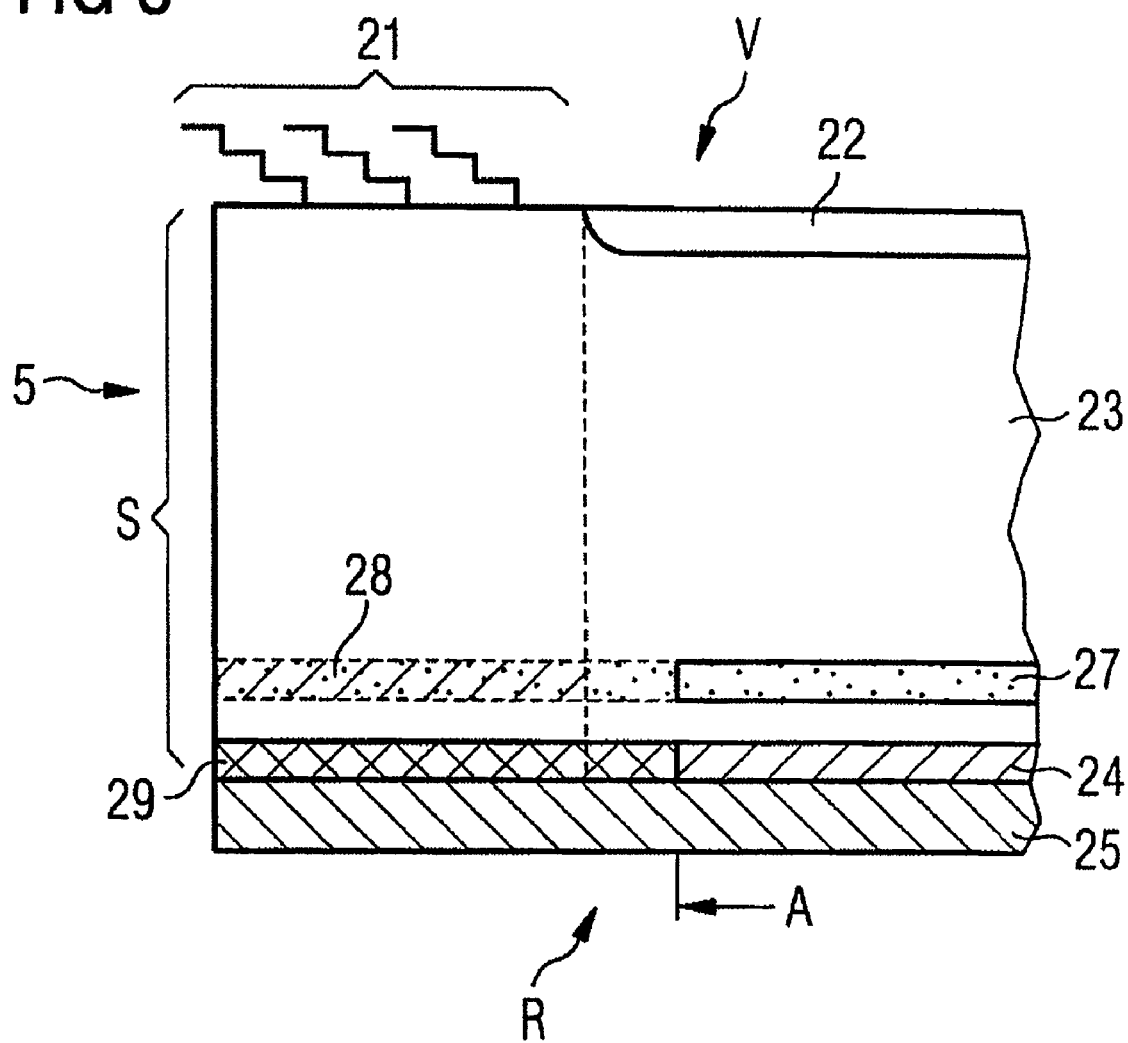
FIG. 5 shows a schematic cross section through a section lying at the edge of a third exemplary embodiment of a high-voltage diode according to the invention.

FIG. 5 shows a schematic cross section in the edge region of a third exemplary embodiment of a high-voltage diode, which is designated by 5. In this case, the structures for forming injection attenuation means are applied by way of example to a high-voltage diode 5, but may also equally be used for an IGBT.

The component 5 proposed here provides for the rear side emitter 24 to be introduced into the chip indeed in whole-area fashion, but to be annealed only in the active region, that is to say not in the edge region 21. As a further measure, it is provided that, in a field stop zone 27 located upstream of the rear side emitter 24, the beam damage of the proton doping is annealed only in the active region of the component, that is to say not or only to an insignificant extent in the edge region 21. Such field stop layers are customary layers in bipolar components for reducing the required chip thickness and thus for effectively optimizing the overall electrical losses. Consequently, the component 5 shown in FIG. 5 and described here can be realized particularly advantageously as a thin wafer component, or the method can be combined with thin wafer processes.

In order to fabricate the component 5 according to the invention, after the thinning of the chips on the wafer to their final thickness, both the rear side emitter and the proton field stop are preferably introduced by means of ion implantation. The crystal damage left behind by the implantation in the basic material constitutes highly effective recombination centers which drastically reduce the carrier lifetime. The injection into chip regions and thus the charge carrier flooding under critical regions, such as, for example, under the edge 21 or the gate pad of an IGBT, can thus be reduced very effectively. This leads to lower switching losses, on the one hand, and to an increased robustness of the component, on the other hand. In the active area, the crystal damage caused by the implantation is thus not acceptable because the on-state losses would thereby increase to an excessively great extent. Therefore, the implantation damage must be at least partially annealed. It is particularly advantageous to perform the annealing in a masked manner, for example in an RTA process (RTA: Rapid Thermal Annealing). In this case, the edge regions 21 of the chip or the gate pad are situated in the shadow of a mask and are thus not heated so much. In the shaded edge regions, therefore, the crystal damage both of the implantation of the rear side emitter 24 and of the field stop zone 27 is preserved to a greater extent and, consequently, the injection of charge carriers into these chip regions remains weak.

In the case of the RTA process, the temperature that can be reached is limited if a metallization is already situated on the front side V. The temperature and time are likewise limited because the lateral propagation of heat cannot be disregarded. The mask likewise has to be aligned with respect to the front side, as in the known method. However, the tolerance requirements, in the region of an accuracy of a few tens of μm, are only extremely coarse in comparison with customary tolerances in semiconductor technology. As an alternative, the implantations can also be annealed by means of local laser irradiation. Since the individual pulses of the laser irradiation are only very short, the above temperature restriction does not apply even if a metallization is already situated on the front side V of the chip. In this case, only the desired regions on the rear side are irradiated and thus annealed relative to the active regions. The annealing is in this case effected by means of writing with the laser beam or the laser pulses without using a mask. Owing to the coarse tolerance requirements, for the abovementioned methods it is possible to use the same alignment or the same alignment method with respect to the wafer edge or the flats or notches by means of which the initial exposure was coarsely aligned with respect to the wafer. In FIG. 5, the arrow A indicates the lateral extent of the annealed regions in each case of the rear side emitter 24 and of the field stop zone 27. The sections 28 and 29—situated on the left thereof—of the field stop zone 27 and of the rear side emitter 24, respectively, are not annealed or are only weakly annealed, in accordance with the above teaching.

The rear side emitter 14, 14a, 24 can be activated only in the central region of the component and not in the edge region 11, in that, before or after carrying out the ion implantation step which is required for the doping of the rear side emitter, said central region is amorphized by a masked implantation step with nondoping ions such as e.g. silicon or argon and afterward, by means of an annealing step at an elevated temperature, is significantly activated by the recrystallization of the silicon only in the region of amorphization.

The above description should make it comprehensible that both the measure of forming the injection attenuation means by a non-annealed zone 29 lying in the edge region of the cathode 24 applied in whole-area fashion or of the cathode emitter applied in whole-area fashion, and the measure of forming the injection attenuation means by a non-annealed zone 28 lying in the edge region of a field stop zone 27 located upstream of the cathode or the cathode emitter 24, can be used both individually and in combination with one another.

Figure 6:
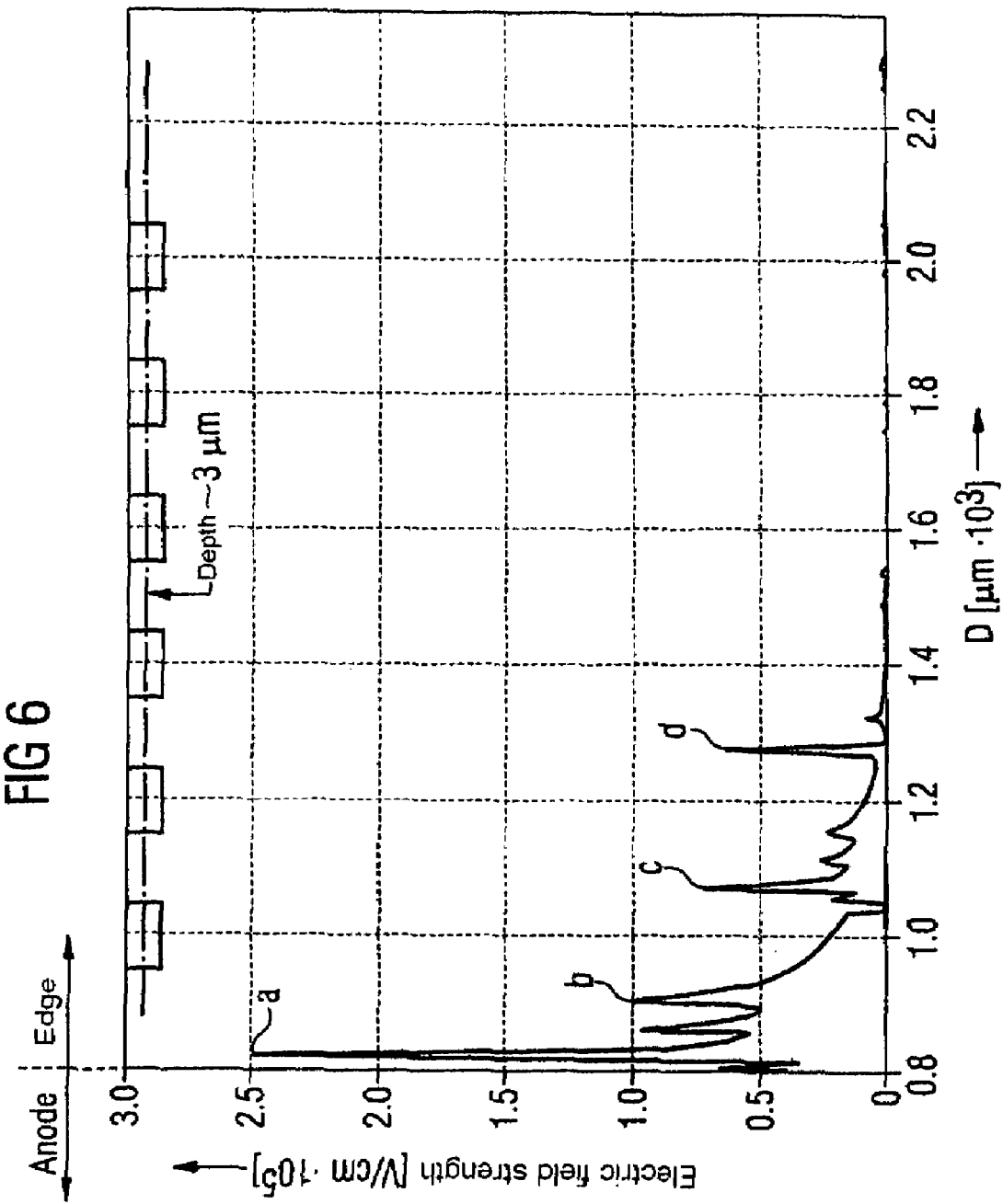
FIG. 6 graphically shows a simulation result of the profile of the electric field strength at the surface (depth approximately 3 μm) in the case of a first exemplary embodiment of a high-voltage diode with a rear side metallization drawn back from the edge and a continuous n-emitter.
Figure 7:
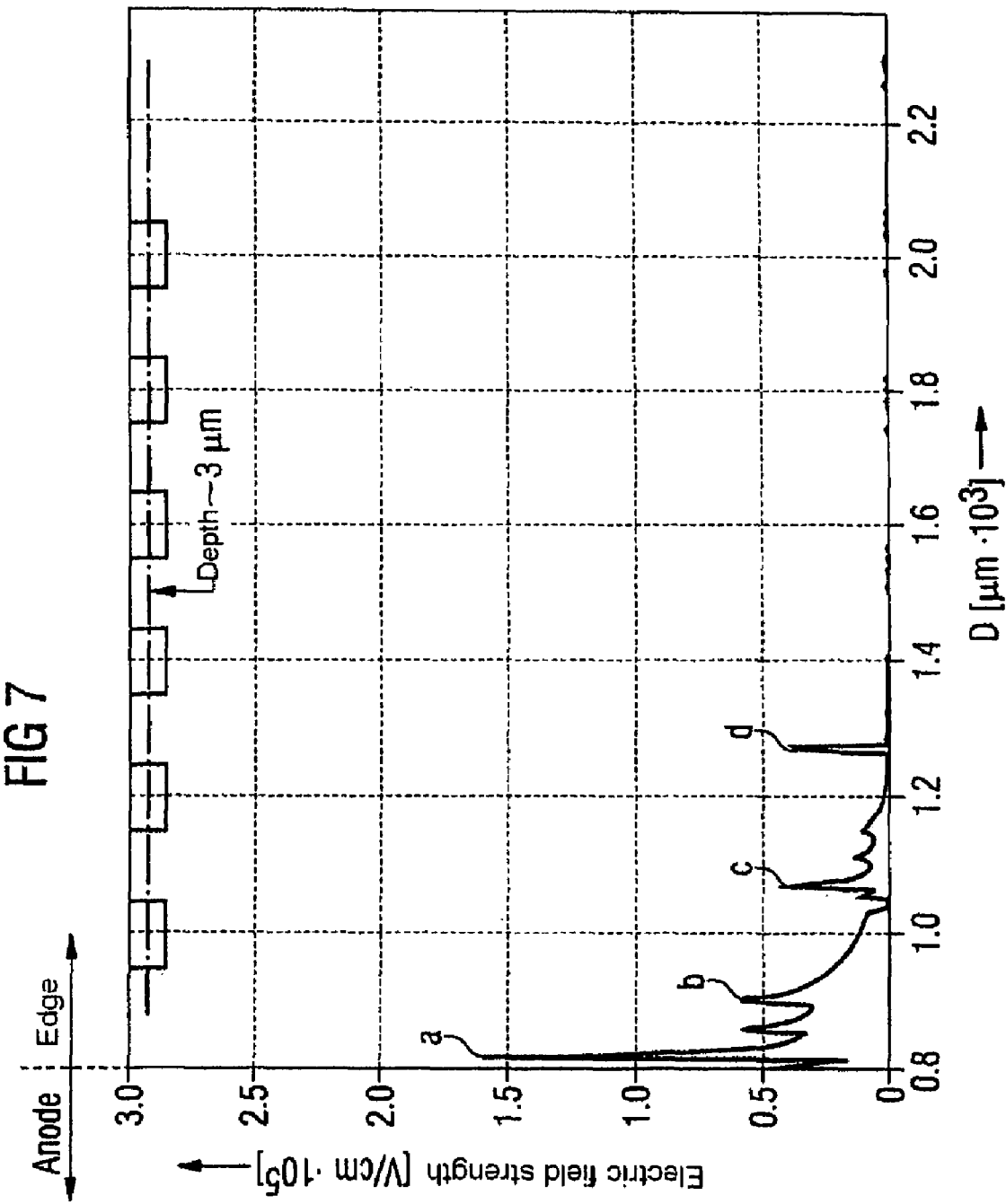
FIG. 7 graphically shows a simulation result of the profile of the electric field strength in the edge region at the surface (depth approximately 3 μm) of a second exemplary embodiment of a high-voltage diode according to the invention with a drawn-back rear side metallization and a drawn-back n-emitter.
Figure 8:
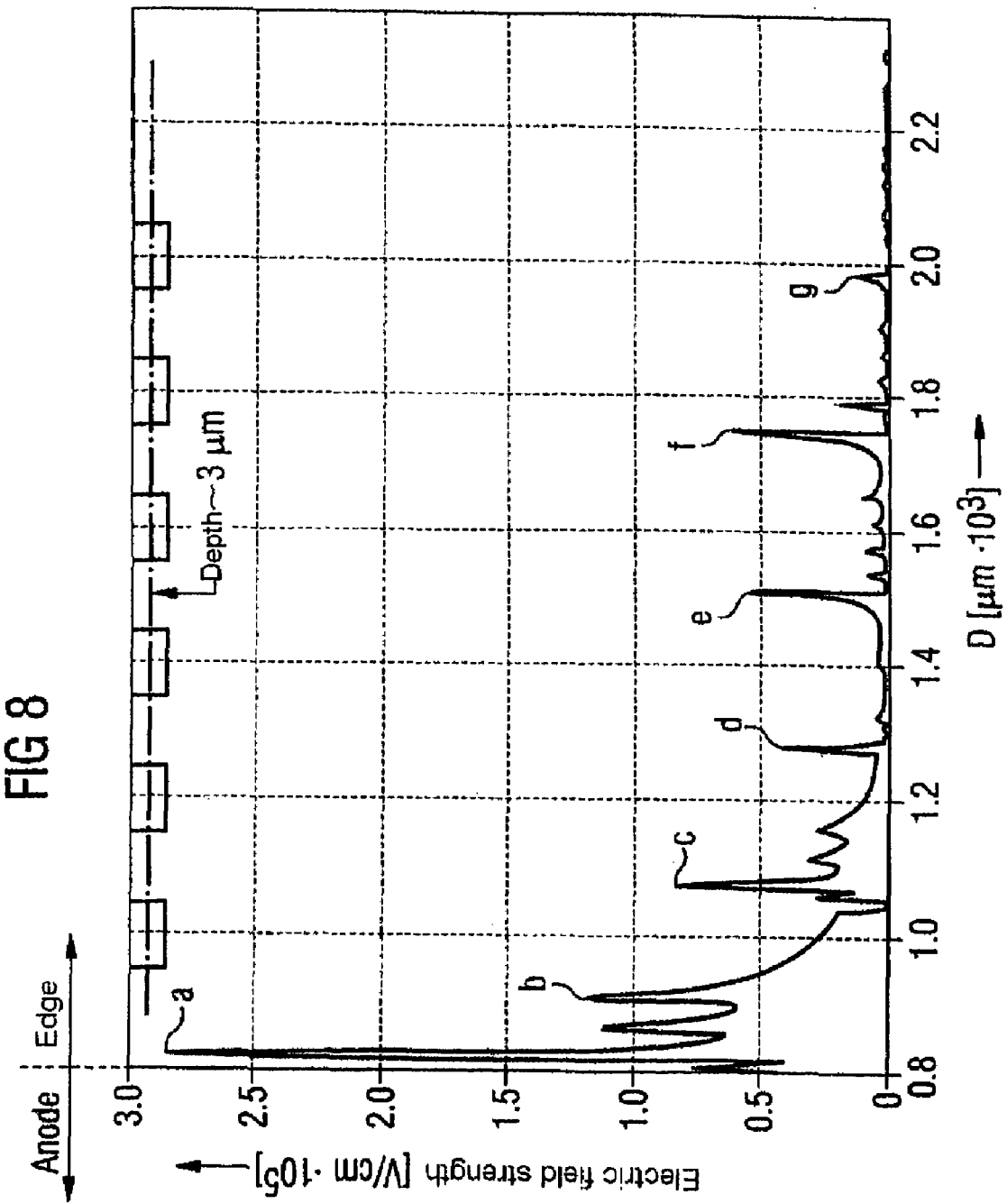
FIG. 8 graphically shows a simulation result of the profile of the electric field strength in the edge region at the surface (depth approximately 3 μm) of a power semiconductor component with a continuous rear side metallization and uninterrupted n-emitter, this power semiconductor component serving as a comparative example.

Of course, in the case of this invention, it is likewise possible to combine one or a plurality of completely annealed or completely non-annealed emitter or field stop layers with locally annealed field stop and/or emitter layers, in order to influence the component properties in a targeted manner. It is also conceivable to amorphize the rear side locally or else in whole-area fashion near the surface by means of a damage implantation for instance in accordance with the above-described exemplary embodiment 4 shown in FIG. 4, in order thus to momentarily melt the amorphized region during a subsequent local laser irradiation or else by means of another annealing method, such as e.g. a conventional furnace process or else an RTA (Rapid Thermal Annealing) process, and in this case to electrically activate the previously implanted dopants in the central region of the component. The preceding amorphization considerably lowers the temperature required for annealing the implanted atoms. If amorphization is effected only locally, lateral doping gradients can be generated even with large-area heat treatment. FIGS. 6 to 8 show component simulations which graphically show the profile of the electric field strength in the edge section of a high-voltage diode at an approximate depth of 3 µm. The distance D from the outer edge of the p-anode 22, said outer edge being represented by the dashed vertical line, is plotted on the abscissas, while the ordinate specifies the electric field strength.

The comparative example of FIG. 8 is based on a conventional high-voltage diode with a continuous rear side metallization and a continuous n-emitter. FIG. 6 is based on a high-voltage diode with a metallization drawn back as far as that end of the p-anode which is identified by the vertical dashed line in combination with a continuous emitter (not illustrated in FIGS. 1 to 5) and FIG. 7 is based on a high-voltage diode with a drawn-back metallization (cf. high-voltage diode 3 in accordance with FIG. 3, second alternative) in combination with an n-emitter destroyed by ion implantation in the edge region (similarly to the IGBT 2 in accordance with FIG. 2).

In comparison with FIG. 8, FIGS. 6 and 7 show that the field strength occurring in the region of the p-well 22, particularly in the case of the diode on which FIG. 7 is based, can be lowered by 20% (spikes a and b), while the field strength spikes occurring in the edge region 21 at the outer field rings (FIGS. 8e, f and g) largely disappear. Particularly in the case of the high-voltage diode on which FIG. 7 is based, the field strength spikes a, b and c are also significantly lower than in the case of the comparative diode in accordance with FIG. 8. The field strength maximum at the p-well edge can also be lowered further, of course, if the metallization 25 is drawn back even further inward, to be precise for example by a diffusion length, as is shown in FIG. 3 by the arrow A indicating the lateral dimensioning of the metallization.

The other injection attenuation means described above have the same effects on the field strength spikes in the edge region, which are not explicitly illustrated here. The dimensioning specification for the distance A between the region of the injection attenuation means and the active region of the component holds true for these measures, too.

The invention claimed is:

1. A vertical power semiconductor component including a semiconductor substrate with a rear side and an edge region, the semiconductor component comprising:
   a. an emitter formed on the rear side of the semiconductor substrate;
   b. a metal layer formed on the rear side of the semiconductor substrate, the metal layer at least partly covering the emitter; and
   c. an injection attenuation means for reducing charge carrier injection from the emitter into the edge region, wherein the injection attenuation means is formed by a non-annealed zone of the emitter, the non-annealed zone lying in the edge region of the emitter, and wherein the non-annealed zone includes crystal damage produced during impurity implantation for forming the emitter and the crystal damage remains in the non-annealed zone as recombination centers.

2. The vertical power semiconductor component of claim 1 wherein the emitter is a cathode emitter.

3. The vertical power semiconductor component of claim 1 wherein the emitter is a collector-side p-emitter.

4. The vertical power semiconductor component of claim 1 wherein the non-annealed zone the of the emitter extends beyond the edge region of the substrate.

5. The vertical power semiconductor component of claim 1 wherein the emitter includes an active area adjacent the non-annealed zone of the emitter.

6. The vertical power semiconductor component of claim 1 further comprising:
   a well of a first conductivity type on a front side of the substrate; and
   a base region of a second conductivity type between the well and the emitter, wherein the emitter is of the first conductivity type.

7. A vertical power semiconductor component including a semiconductor substrate with a rear side and an edge region, the semiconductor component comprising:
   a. an emitter formed on the rear side of the semiconductor substrate, the emitter including an active area and a non-annealed zone adjacent the active area lying substantially in the edge region of the substrate;
   b. a metal layer at least partly covering the active area; and
   c. an injection attenuation means for reducing charge carrier injection from the active area into the edge region, wherein the injection attenuation means is formed by the non-annealed zone of the emitter such that crystal damage produced during impurity implantation and the crystal damage remains in the non-annealed zone as recombination centers.

8. The vertical power semiconductor component of claim 7 wherein the emitter is a cathode emitter.

9. The vertical power semiconductor component of claim 7 wherein the emitter is a collector-side p-emitter.

10. A vertical power semiconductor component including a semiconductor substrate with a rear side and an edge region, the semiconductor component comprising:
    an emitter implanted on substantially the entire rear side of the semiconductor substrate, the emitter including an annealed zone configured as an active area for the emitter and a non-annealed zone lying substantially in the edge region of the substrate; and a metal layer at least partly covering the active area of the emitter;

wherein the non-annealed zone comprises an injection attenuation means such that crystal damage in the edge region of the emitter produced during the implantation the emitter acts as recombination centers.

11. The vertical power semiconductor component of claim 10 wherein the emitter is a cathode emitter.

12. The vertical power semiconductor component of claim 10 wherein the emitter is a collector-side p-emitter.

13. The vertical power semiconductor component of claim 10 wherein the annealed and non-annealed zones of the emitter are adjacent each other.

14. The vertical power semiconductor component of claim 13 wherein the non-annealed zone of the emitter extends laterally beyond the edge region of the substrate.

* * * * *